United States Patent [19]
Robertson

[11] Patent Number: 5,813,095
[45] Date of Patent: Sep. 29, 1998

[54] RE-CLOSABLE SURFACE BINDING METHOD

[76] Inventor: Thomas Wilson Robertson, 3 Swift La., Merrimack, N.H. 03054

[21] Appl. No.: 762,797

[22] Filed: Dec. 9, 1996

[51] Int. Cl.⁶ .................................................. A44B 18/00
[52] U.S. Cl. ................................ 24/442; 24/306; 24/452
[58] Field of Search .............................. 24/442, 444, 306, 24/450, 452; 128/DIG. 15; 2/912; 36/93

[56] References Cited

U.S. PATENT DOCUMENTS

| | | | |
|---|---|---|---|
| 3,101,517 | 8/1963 | Fox et al. .................................. | 24/442 |
| 3,128,514 | 4/1964 | Parker ........................................ | 24/11 |
| 3,266,113 | 8/1966 | Flanagan, Jr. ............................. | 24/452 |
| 3,471,903 | 10/1969 | Northrup et al. ........................ | 24/306 |
| 3,526,867 | 9/1970 | Keeler, II .................................. | 24/442 |
| 4,946,527 | 8/1990 | Battrell .................................... | 156/60 |
| 5,149,573 | 9/1992 | Kobe ...................................... | 428/93 |
| 5,212,853 | 5/1993 | Kaneko .................................... | 24/452 |
| 5,383,290 | 1/1995 | Grim ......................................... | 36/93 |
| 5,396,687 | 3/1995 | Osterman ................................. | 24/449 |
| 5,586,372 | 12/1996 | Eguchi et al. ............................ | 24/442 |
| 5,598,610 | 2/1997 | Torigoe et al. ........................... | 24/442 |

Primary Examiner—Victor N. Sakran

[57] ABSTRACT

The following invention details how two surfaces can be bound together. One surface (23) contains loosely spaced pins (24) with heads (25) which can be engaged into an array of tightly packed bulbous elements (22) upon another surface (20). The pins are then retained by constraining the array in various ways. The surfaces can be released by un-constraining the array of bulbous elements. This procedure may be repeated a multitude of times.

20 Claims, 11 Drawing Sheets

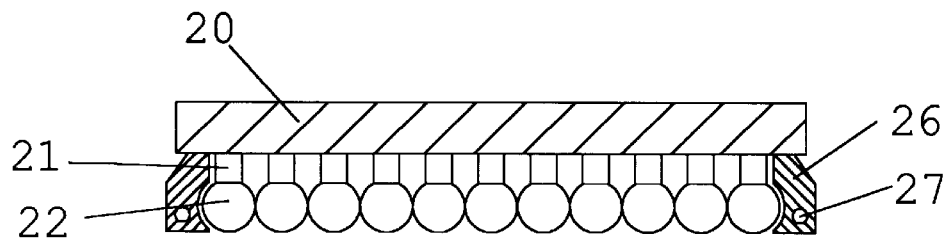
FIG 3A
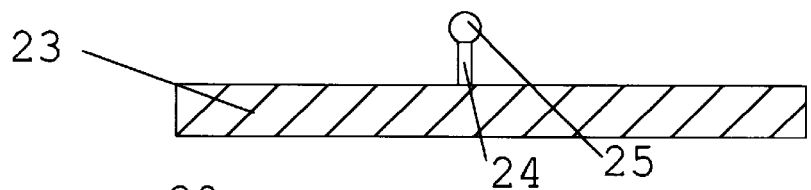
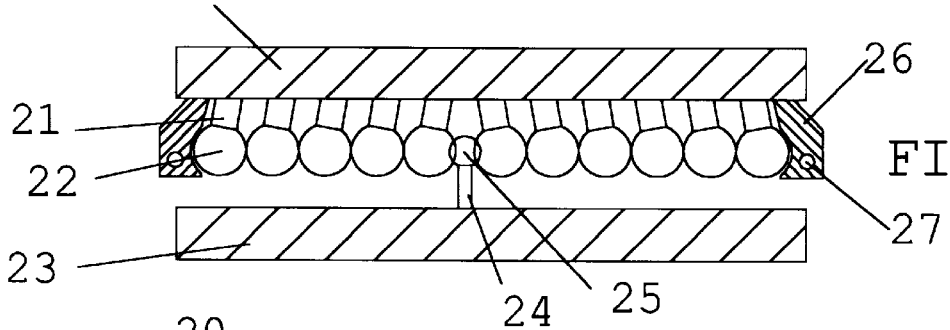
FIG 3B
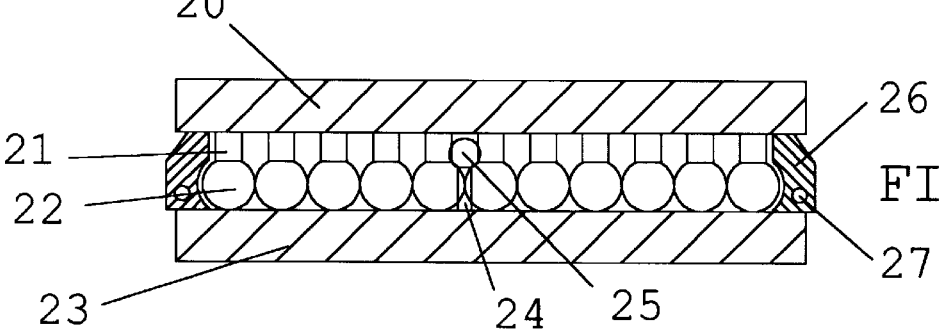
FIG 3C

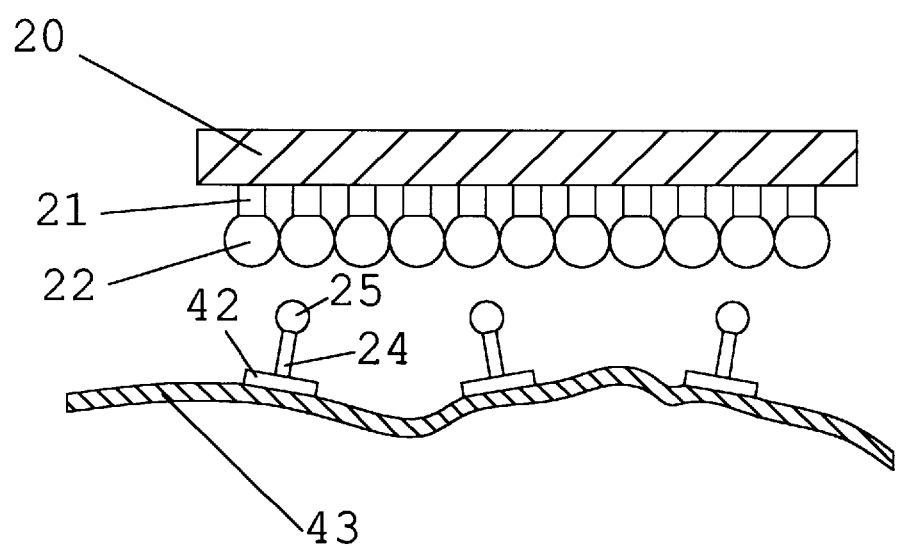

RE-CLOSABLE SURFACE BINDING METHOD

BACKGROUND FIELD OF INVENTION

This invention relates to the binding of two surfaces and the subsequent unbinding of said surfaces a multitude of times.

1. Background-Description of Prior Art

Various types of fasteners comprising complementary pairs of articles capable of engaging and holding to one another over an area or surface are known. In one type the holding power is derived from the entanglement of elements which vary from very light textile filaments to wires which are shaped as hooks, loops, etc. (see Swiss Patent 295,638, U.S. Pat. No. 2,717,437). These fasteners have varying holding force and will yield without damage if a predetermined separating force is reached. They are not generally acceptable as a heavy duty fastener and are susceptible to foreign matter such as snow or mud interfering with there operation. Attempts to make a more uniform holding force are evident with the review of (Flanngan, Jr. (3,266,113)) which shows a fastener having a pair of inter-engaging surfaces having multiple rows of flexible cam elements with various shaped heads. This technique depends on a substantial force being required to move adjacent elements out of their normal relative position and the normal relative positions are regained immediately upon removal of the force. Areas of this fastener are intentionally left blank to allow elements to flex into these voids so that mating elements can penetrate the array. In a similar fashion (Kaneko (5,212,853)) and (Kobe et al. (5,149,573)) show separable fasteners with umbrella shaped elements formed on each base and which engage each other to hold the pieces together. (Parker et al. (3,128,514)) (FIG. 12) and (Battrell (4,946,527)) show separable fasteners with round headed elements. (Osterman (5,396,687)) discloses a separable fastener having posts with multiple heads. All of these examples hold the surfaces together using pliable elements which depend on there elasticity as a constituent of the holding force.

The apparatus disclosed in this document has many advantages over the prior art. First this said fastener has a variable holding force independent to the closing force allowing the fastener to have near zero closing force and either rigid or variable holding force. Second this fastener in not sensitive to foreign material such as snow or mud in the joint. Third this fastener is a scaleable system where more robust systems can be made from the same material independent of the materials elasticity.

2. Objects and Advantages

Accordingly, the object and advantages of the present invention are:

(a) to provide an apparatus for binding one surface to another surface in a way that the surfaces can be quickly engaged at any location and in any rotation;

(b) to provide an apparatus for binding that can provide rigid and sure closure between the two surfaces;

(c) to provide an apparatus for binding that is insensitive to foreign matter in the closure system;

(d) to provide an apparatus for binding that can be adjusted as to regulate the force needed to separate the two surfaces independent of the closing force;

(e) to provide an apparatus for binding that will have repeatable closure holding force;

(f) to provide an apparatus for binding that can be opened remotely;

(g) to provide an apparatus for binding where multiple units can be opened simultaneously;

(h) to provide an apparatus for binding that holds with the same force even if lubricants are introduced into the joint;

(i) to provide an apparatus for binding that will resist torsional as well as lateral movement between said surfaces.

Further objectives and advantages will become apparent from a consideration of the ensuing description and drawings.

DRAWING FIGURES

In the drawings, closely related figures have the same number but different alphabetical suffixes.

FIG. 3A is a side view of a developed binding apparatus in the un-bound condition with a flexible boundary collar which contains a flexible tensioning element passageway.

FIG. 3B is a side view of a developed binding apparatus in the engaging condition with a flexible boundary collar which contains a flexible tensioning element passageway.

FIG. 3C is a side view of a developed binding apparatus in the bound condition with a flexible boundary collar which contains a flexible tensioning element passageway.

Figure 10A:
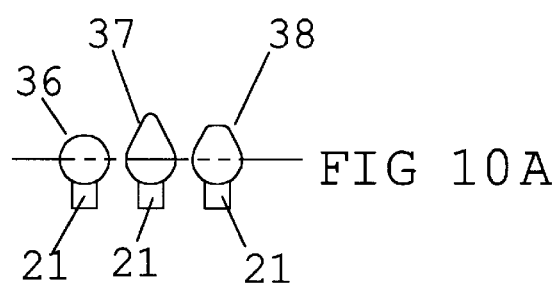
FIG. 10A is a side view of variations to the upper hemispheres of locking elements used in the basic binding apparatus.
Figure 10B:
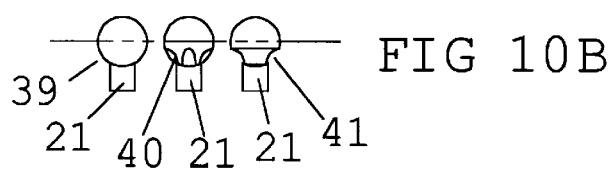
FIG. 10B is a side view of variations to the lower hemispheres of locking elements used in the basic binding apparatus.
Figure 10C:
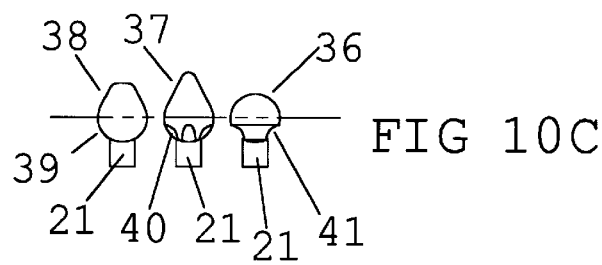

Fig. 10C a side view of combinations of the variations to the upper and lower hemispheres of locking elements used in the basic binding apparatus.

Figure 11:
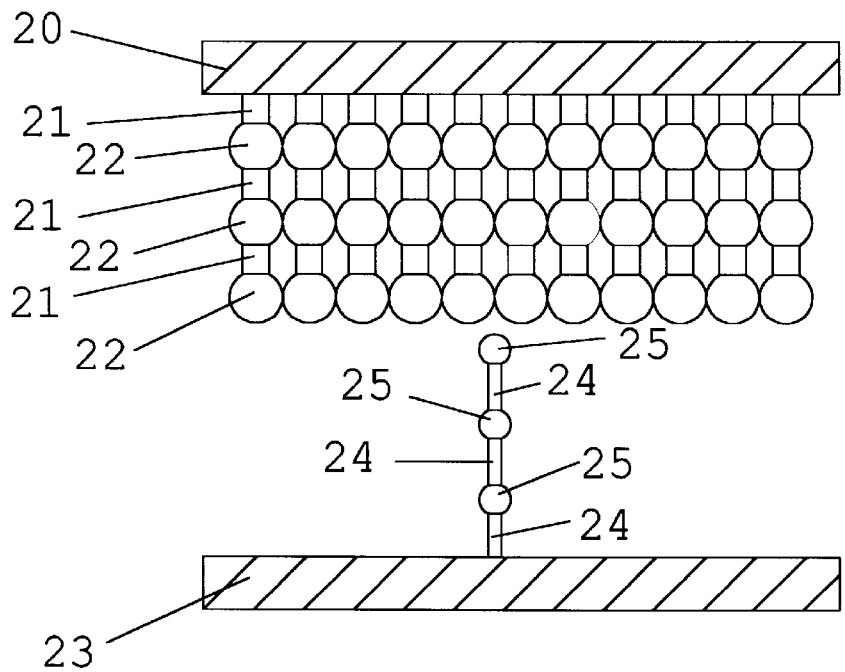

FIG. 11 is a side view of the basic binding apparatus in the un-bound condition which has been modified by vertically varying the number of locking element in the clamping array and striker pin heads.

Figure 12:
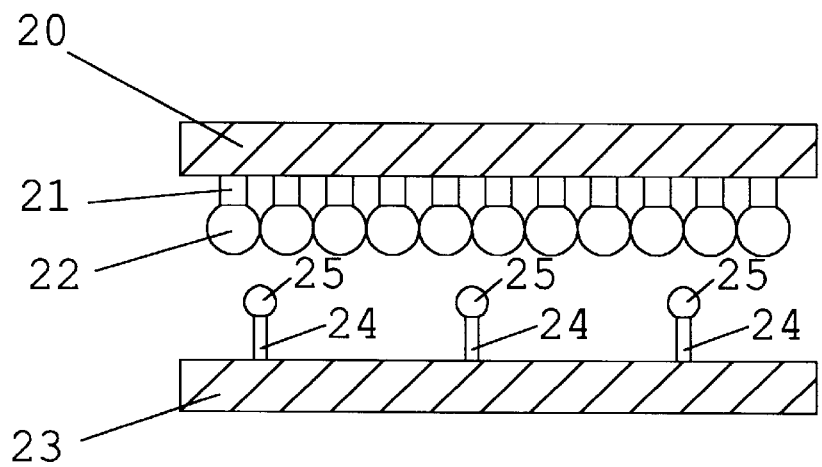

FIG. 12 is a side view of the basic binding apparatus in the un-bound condition which has been modified by horizontally varying the number of striker pins.

FIG. 13 is a side view of the basic binding apparatus in the un-bound condition where the striker pin base plate has been replaced by a flexible material.

Figure 14A:
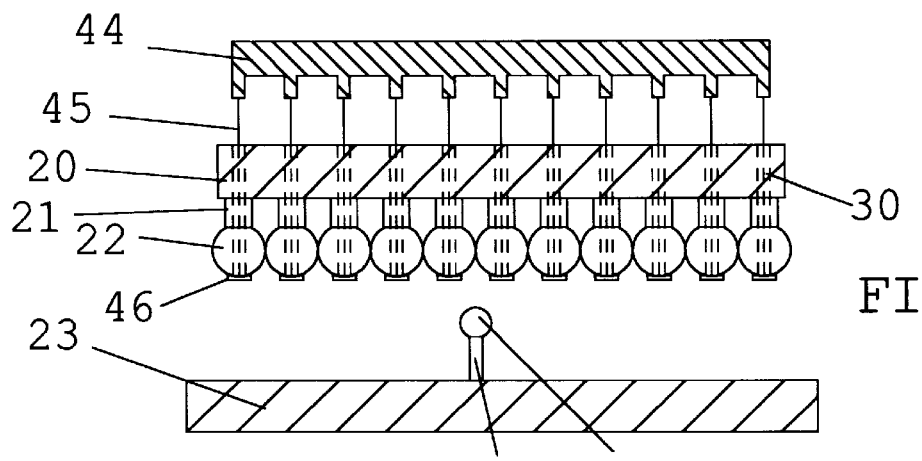

FIG. 14A is a side view of the basic binding apparatus in the un-bound condition where bulbous element 22 and bulbous element shaft 21 are held to rigid clamping array base plate 20 by way of flexible tensioning element 45 and upward force on rigid pulling member 44.

Figure 14B:
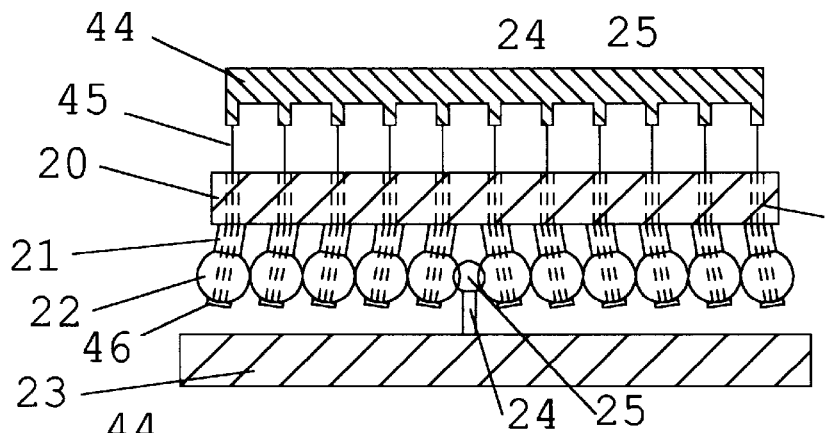

FIG. 14B is a side view of a developed binding apparatus in the engaging condition where bulbous element 22 and bulbous element shaft 21 are held to rigid clamping array base plate 20 by way of flexible tensioning element 45 and upward force on rigid pulling member 44.

Figure 14C:
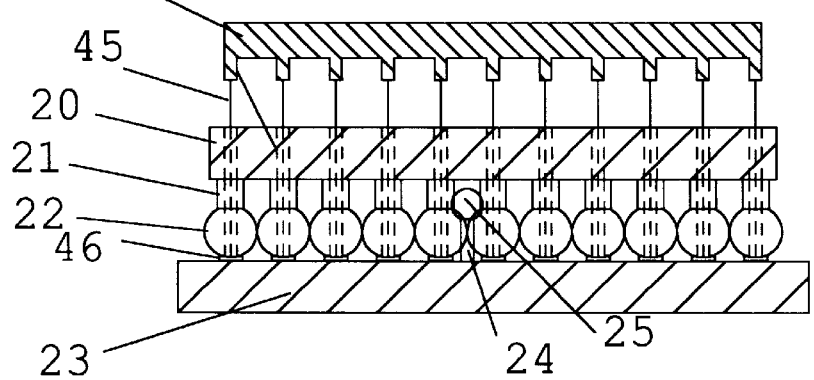

FIG. 14C is a side view of a developed binding apparatus in the bound condition where bulbous element 22 and bulbous element shaft 21 are held to rigid clamping array base plate 20 by way of flexible tensioning element 45 and upward force on rigid pulling member 44.

| | |
|---|---|
| 20 rigid clamping array base plate | 33 inflatable boundary collar |
| 21 bulbous element shaft | 34 locking element relief hole for striker pin |
| 22 bulbous element | |
| 23 rigid striker plate | 35 locking element flat face |
| 24 striker pin post | 36 round top locking element |
| 25 striker pin head | 37 cone top locking element |
| 26 flexible boundary collar | 38 truncated cone top locking element |
| 27 flexible tensioning element passage | 39 round bottom locking element |
| 28 rigid boundary collar | 40 cupped bottom locking element |
| 29 internal stiffener | 41 grooved bottom locking element |
| 30 (passage through the rigid clamping array base plate, bulbous element shaft, and bulbous element) | 42 striker pin mounting plate |
| | 43 flexible material |
| | 44 rigid pulling member |
| | 45 flexible tensioning element |
| 31 engagement surface | 46 flexible tensioning element retainer |
| 32 pocket | |

1. Description-FIGS. 1 to 14

Figure 1A:
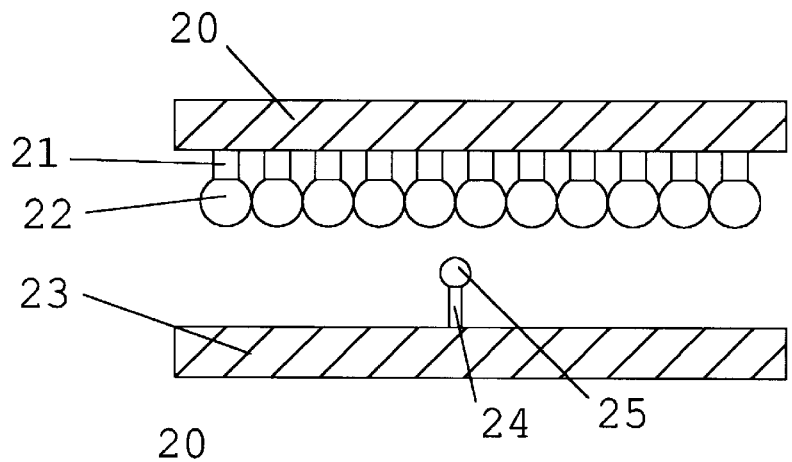
FIG. 1A is a side view of the basic binding apparatus in the un-bound condition with no side restraint.
Figure 1B:
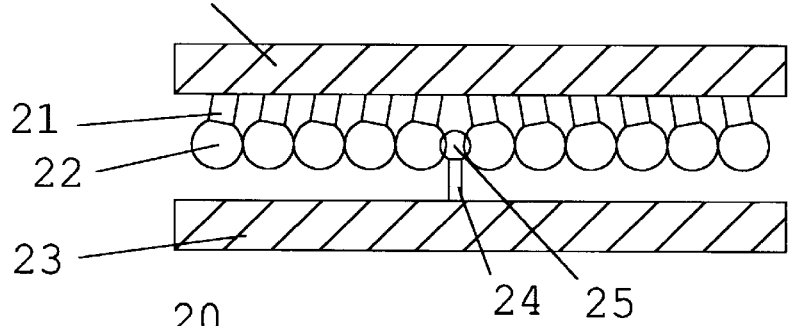
Fig. 1B is a side view of the basic binding apparatus in the engaging condition with no side restraint.
Figure 1C:
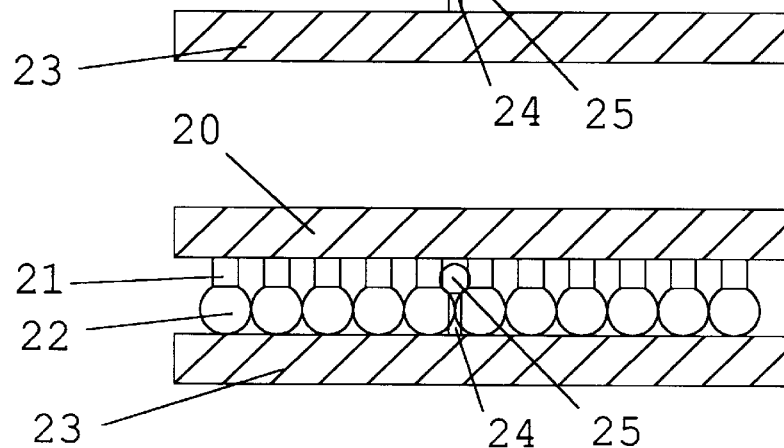
FIG. 1C is a side view of the basic binding apparatus in the bound condition with no side restraint.

The basic components for this invention can be understood by a review of FIGS. 1A, 1B, 1C They show an array of bulbous elements 22 mounted to a rigid clamping array base plate 20 by way of a bulbous element shafts 21. A striker pin head 25 is mounted to a rigid striker plate 23 by way of a striker pin post 24. One option for material selection and construction would be to fabricate bulbous element 22 using a mild steel, bulbous element shaft 21 using a natural rubber, rigid clamping array base plate 20 and rigid striker plate 23 using wood. Bulbous element 22 could then be fastened using adhesive to bulbous element shaft 21 and then fastened to rigid clamping array base plate 20 using adhesive. Striker pin head 25 is mounted to rigid striker plate 23 by way of striker pin post 24. One option for material selection and construction would be to fabricate striker pin post 24 and striker pin head 25 using a mild steel, and use wood for rigid striker plate 23. Whereby striker pin head 25 is screwed into rigid striker plate 23 by way of threads at the base of striker pin post 24. Striker pin head 25 is shown engaging the array of bulbous elements 22 in FIG. 1B.

Figure 2A:
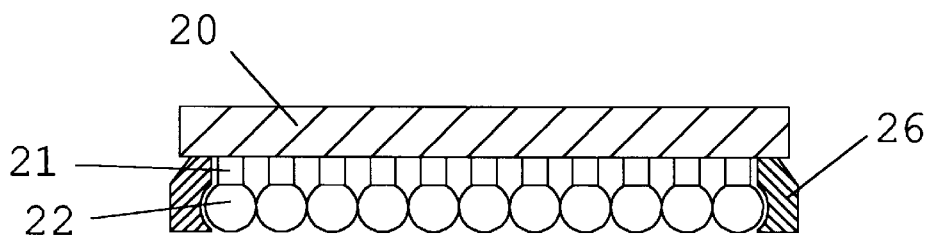
FIG. 2A is a side view of a developed binding apparatus in the un-bound condition with a flexible boundary collar.
Figure 2B:
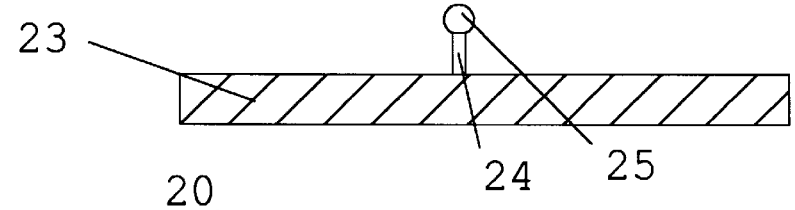
FIG. 2B is a side view of a developed binding apparatus in the engaging condition with a flexible boundary collar.
Figure 2C:
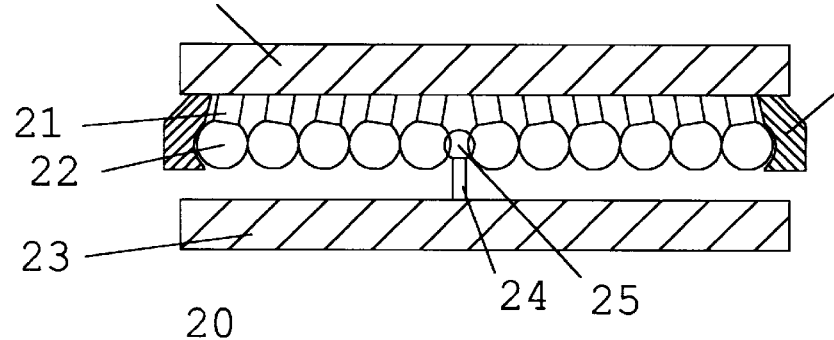
FIG. 2C is a side view of a developed binding apparatus in the bound condition with a flexible boundary collar.

To increase the holding force within the array a flexible boundary collar 26 can be employed as in FIGS. 2A, 2B, 2C. To provide a holding force of even greater magnitude a flexible tensioning element passage 27 is placed in flexible boundary collar 26 in FIGS. 3A, 3B, 3C. This passage could contain a cable or any other flexible component that can be placed in tension without considerable elongation.

Figure 4A:
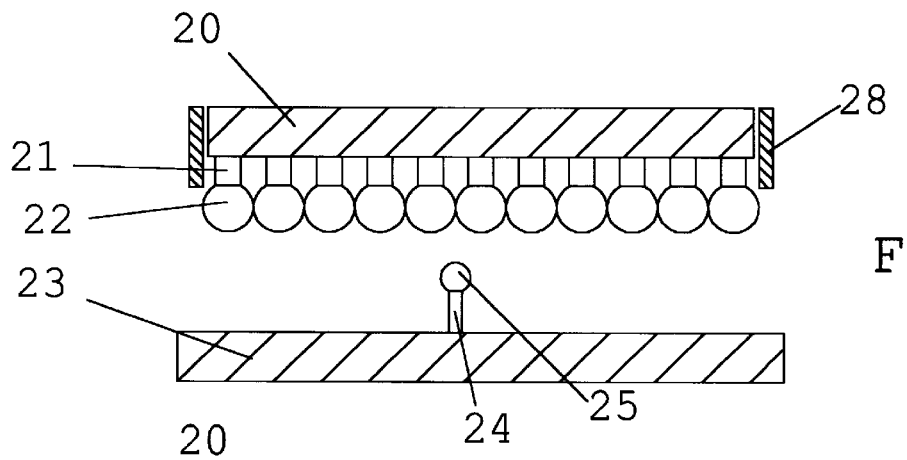
FIG. 4A is a side view of a developed binding apparatus in the un-bound condition with a rigid boundary collar in a raised or unlocked position.
Figure 4B:
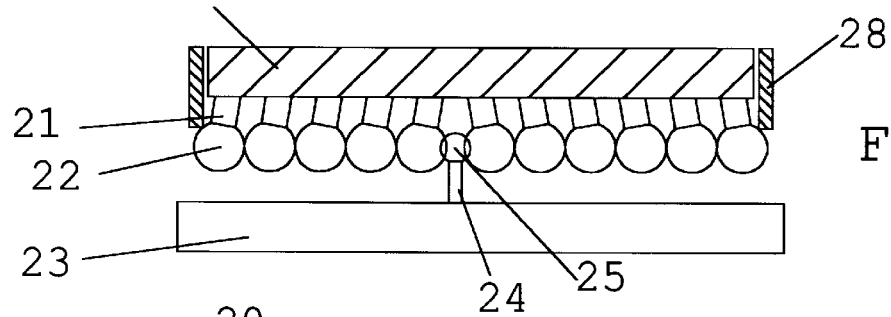
FIG. 4B is a side view of a developed binding apparatus in the engaging condition with a rigid boundary collar in a midway or intermediate position.
Figure 4C:
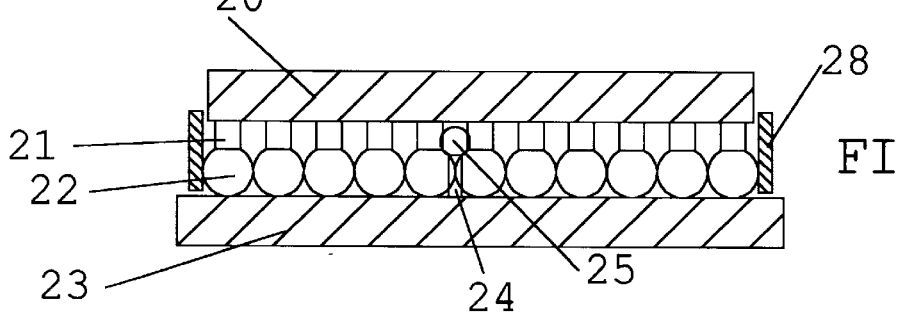
FIG. 4C is a side view of a developed binding apparatus in the bound condition with a rigid boundary collar in a lowered or locked position.

FIGS. 4A, 4B, 4C use a rigid boundary collar 28 to constrain the array of bulbous elements 22.

Figure 5A:
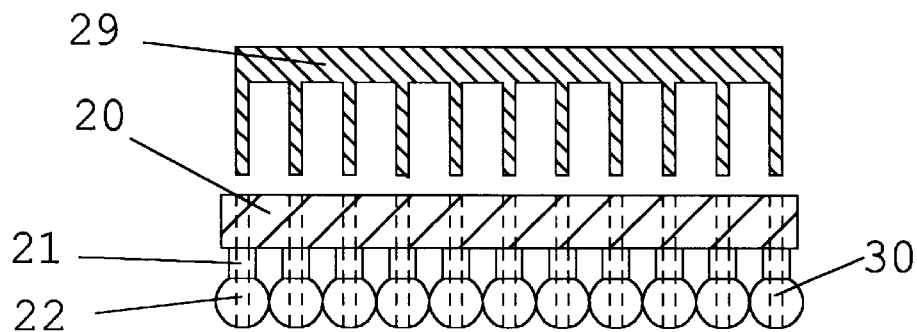
FIG. 5A is a side view of a developed binding apparatus in the un-bound condition with an internal stiffener in a raised or unlocked position.
Figure 5B:
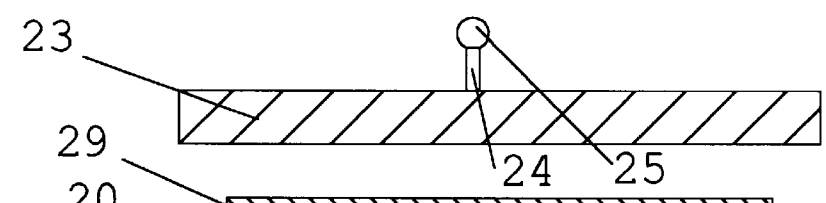
FIG. 5B is a side view of a developed binding apparatus in the engaging condition with an internal stiffener in a midway or intermediate position.
Figure 5C:
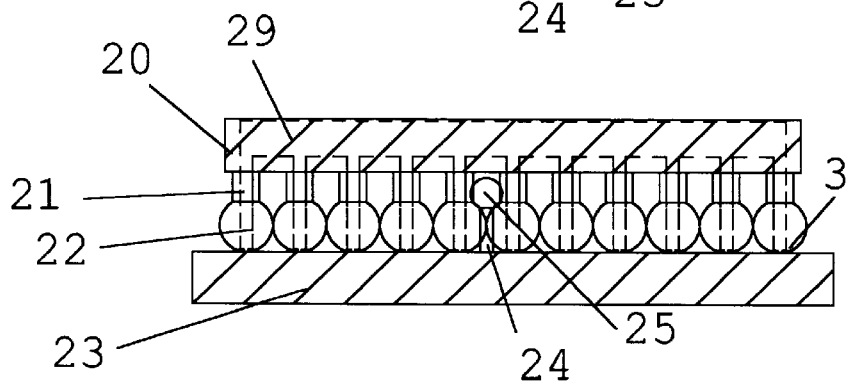
FIG. 5C is a side view of a developed binding apparatus in the bound condition with an internal stiffener in a lowered or locked position.

FIGS. 5A, 5B, 5C show another method envisioned for locking the array of bulbous elements 22 into place. In FIG. 5A a (passage through the rigid clamping array base plate, bulbous element shaft, and bulbous element) 30 has been added to the array system. This (passage through the rigid clamping array base plate, bulbous element shaft, and bulbous element) 30 allows an internal stiffener 29 to be inserted into rigid clamping array base plate 20 as shown in FIG. 5B.

Figure 6A:
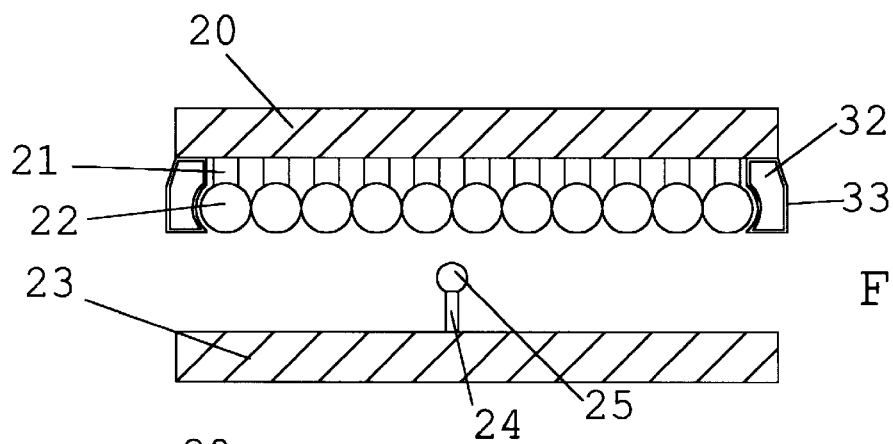
FIG. 6A is a side view of a developed binding apparatus in the un-bound condition with an inflatable boundary collar in a state of low pressure or unlocked position.
Figure 6B:
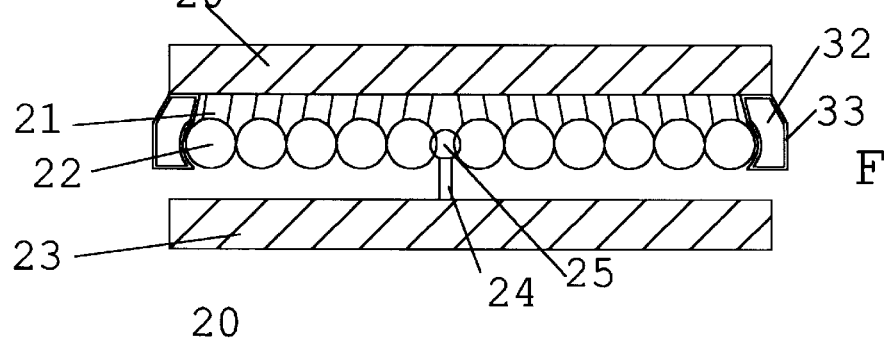
FIG. 6B is a side view of a developed binding apparatus in the engaging condition with an inflatable boundary collar in a state of low pressure or unlocked position.
Figure 6C:
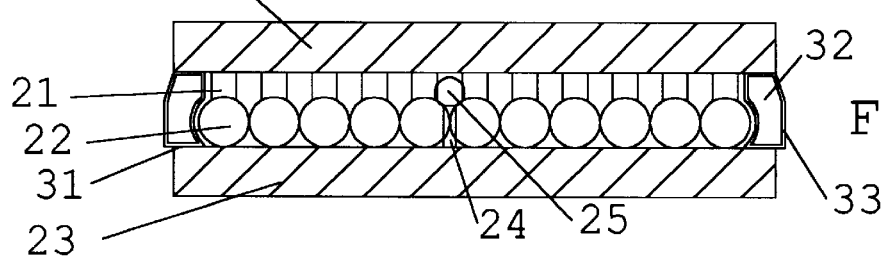
FIG. 6C is a side view of a developed binding apparatus in the bound condition with an inflatable boundary collar in a state of high pressure or locked position.

FIGS. 6A, 6B, 6C show another alternative for constraining the array of bulbous elements 22. In FIG. 6A an inflatable boundary collar 33 is used to constrain the array of bulbous elements 22 instead of using the flexible boundary collar 26 or rigid boundary collar 28.

Figure 7:
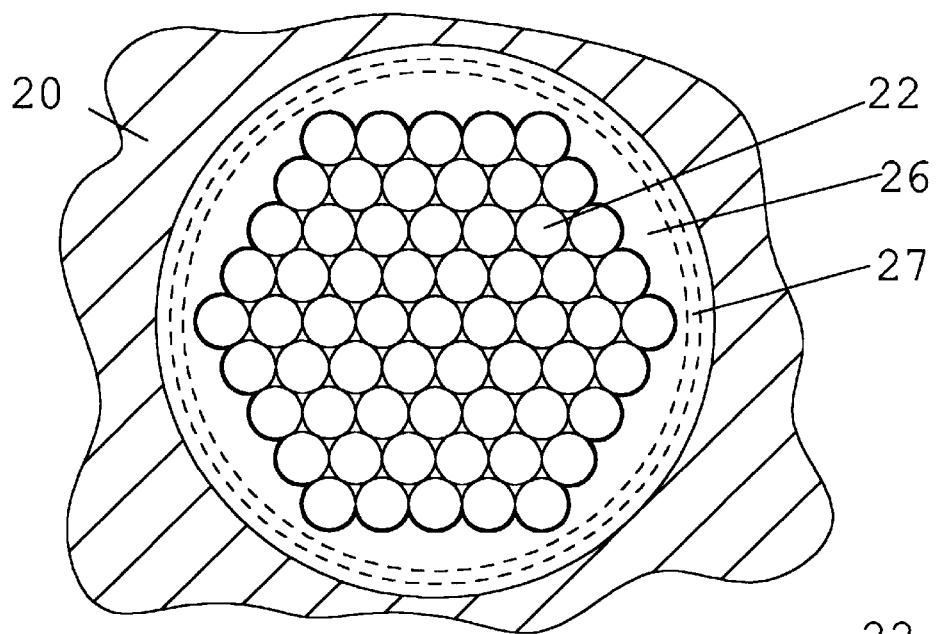
FIG. 7 is a plan view of the flexible boundary binding apparatus shown in FIGS. 3A, 3B, 3C mounted to a surface in a circular fashion.
Figure 8:
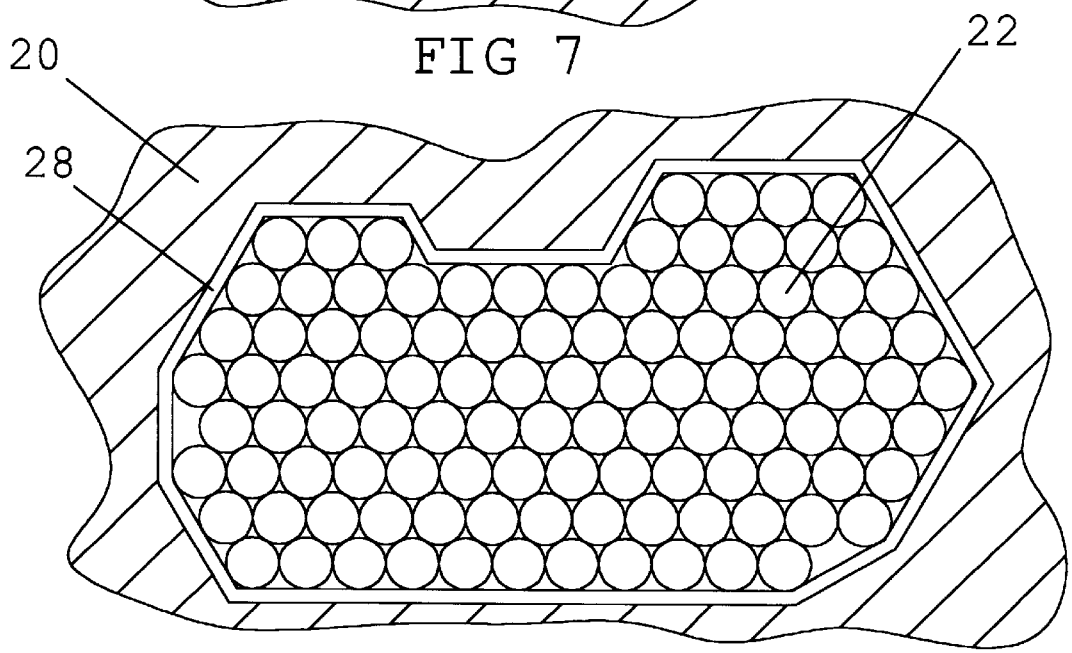
FIG. 8 is a plan view of the rigid boundary binding apparatus shown in FIGS. 4A, 4B, 4C mounted to a surface.
Figure 9A:
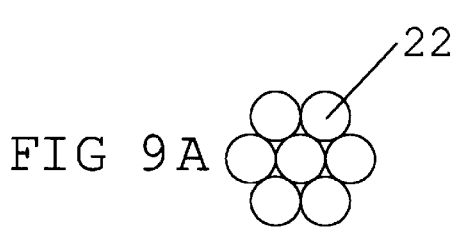
FIG. 9A, 9B, 9C is a plan view of variations of locking elements used in the basic binding apparatus.
Figure 9B:
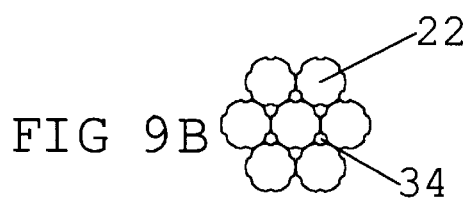
Figure 9C:
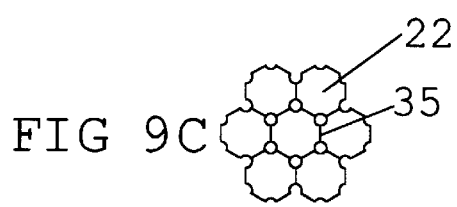

The area inscribed by a fixed distance of perimeter is maximized in the shape of a circle. FIG. 7 shows the preferred embodiment of the array of bulbous element 22 using either flexible boundary collar 26 or inflatable boundary collar 33.

Some foreseeable variations to the previous arrangements are discussed in FIGS. 9, 10, 11, 12, 13. FIG. 9A depicts bulbous element 22 as sphere like entities. FIG. 9B shows that a locking element relief hole for striker pin 34 can be placed into the construction of bulbous element 22. FIG. 9C shows that a more rigid array might be achieved by placing a locking element flat face 35 into the construction of bulbous element 22. Fig. 10A shows variations to the actual shape of the upper hemisphere of bulbous element 22 as depicted by a round top locking element 36, a cone top locking element 37, and a truncated cone top locking element 38. Fig. 10B shows variations to the actual shape of the lower hemisphere of bulbous element 22 as depicted by a round bottom locking element 39, a cupped bottom locking element 40, and a grooved bottom locking element 41. Fig. 10C shows various combinations of the variations shown in FIG. 10A and FIG. 10B. Fig.11 shows that the array of bulbous elements 22 can be altered by adding consecutive bulbous elements 22 and bulbous element shafts 21 to rigid clamping array base plate 20. FIG. 13 shows striker pin head 25 and striker pin post 24 being, attached to a flexible material 43 by way of a striker pin mounting plate 42.

FIG. 14A, 14B, 14C depicts a method for constraining the array be means of a flexible tensioning element 45 and a rigid pulling member 44. In FIG. 14A flexible tensioning element 45 are attached to a rigid pulling member 44 which pass through (passage through the rigid clamping array base plate, bulbous element shaft, and bulbous element) 30 and are retained by a flexible tensioning element retainer 46.

OPERATION OF INVENTION

The basis for this invention can be understood by a review of FIGS. 1A, B, 1C. They depict an array of bulbous elements 22 mounted to rigid clamping array base plate 20 by way of bulbous element shafts 21 which is flexible but has limited compressive ability. As rigid clamping array base plate 20 and rigid striker plate 23 are moved closer to one another striker pin head 25 displaces the array of bulbous elements 22 until striker pin head 25 passes bulbous element 22 and the array of bulbous elements 22 moves into their initial location as shown in FIG. 1C. The resilience of bulbous element shaft 21 will provide some holding force between rigid clamping array base plate 20 and rigid striker plate 23. The contact angle between striker pin head 25 and adjoining bulbous elements 22 is one of the main variables in the holding force achieved by this apparatus. This angle can be changed by varying the relational size between bulbous element 22 and striker pin head 25. It can also be varied by changing the shapes of the elements. One option for material selection and construction would be to fabricate bulbous element 22 using a mild steel, bulbous element shaft 21 using a natural rubber, rigid clamping array base plate 20 and rigid striker plate 23 using wood. Bulbous element 22 could then be fastened using adhesive to bulbous element shaft 21 and then fastened to rigid clamping array base plate 20 using adhesive. Striker pin head 25 is mounted to rigid striker plate 23 by way of striker pin post 24. One option for material selection and construction would be to fabricate striker pin post 24 and striker pin head 25 using a mild steel, and use wood for rigid striker plate 23. Whereby striker pin head 25 is screwed into rigid striker plate 23 by way of threads at the base of striker pin post 24. Striker pin head 25 is shown engaging the array of bulbous elements 22 in FIG. 11B.

To increase this holding force flexible boundary collar 26 can be employed as in FIGS. 2A, 2B, 2C. Here the array of bulbous elements 22 has to displace or elongate flexible boundary collar 26 so that striker pin head 25 can penetrate the array of bulbous elements 22 as shown in FIG. 2B. In FIG. 2C it is seen that striker pin head 25 can not leave the array of bulbous elements 22 until flexible boundary collar 26 deforms. In the preferred embodiment flexible boundary collar 26 would be in a circular orientation as shown in FIG. 7 so that any deformation will cause an area reduction in the array and cause it to hold striker pin head 25 even tighter. To provide a holding force of even greater magnitude a flexible tensioning element passage 27 is placed in flexible boundary collar 26 in FIGS. 3A, 3B, 3C. This passage could contain a cable or any other flexible component that can be placed in tension without considerable elongation. This cable can be remotely tensioned and released. This is one embodiment used for synchronizing multiple locking and releasing of the array of bulbous elements 22.

Another option for constraining the array of bulbous elements 22 is shown in FIGS. 4A, 4B, 4C. These Figs. use rigid boundary collar 28 to constrain the array of bulbous elements 22. In FIG. 4A rigid boundary collar 28 is in a raised position so that bulbous elements 22 can be displaced as striker pin head 25 is engaged into the array of bulbous elements 22 as shown in FIG. 4B. Rigid boundary collar 28 is then lowered to constrain the array of bulbous elements 22 and retain striker pin head 25 into the array of bulbous elements 22 as shown in FIG. 4C. The advantage of using rigid boundary collar 28 is that the array does not need to be in a circular orientation for binding rigid clamping array base plate 20 to rigid striker plate 23.

FIGS. 5A, 5B, 5C depict another method envisioned for locking the array of bulbous elements 22 into place. In FIG. 5A (passage through the rigid clamping array base plate, bulbous element shaft, and bulbous element) 30 has been added to the array system. This (passage through the rigid clamping array base plate, bulbous element shaft, and bulbous element) 30 allows internal stiffener 29 to be inserted into rigid clamping array base plate 20 as shown in FIG. 5B. Bulbous element 22 is free to be displaced by striker pin head 25 as long as internal stiffener 29 is not engaged into bulbous element shaft 21 or bulbous element 22. After striker pin head 25 has been inserted past bulbous element 22 then internal stiffener 29 is inserted so that bulbous element shaft 21 and bulbous element 22 are constrained and the array of bulbous elements 22 will not allow striker pin head 25 to disengage for the array of bulbous elements 22.

FIGS. 6A, 6B, 6C show another alternative for constraining the array of bulbous element 22. In FIG. 6A inflatable boundary collar 33 is used instead of flexible boundary collar 26 or rigid boundary collar 28. Inflatable boundary collar 33 encases pocket 32 which can be pressurized or filled with an incompressible fluid to constrain the array of bulbous elements 22.

The area inscribed by a fixed distance of perimeter is maximized in the shape of a circle. FIG. 7 shows the preferred embodiment of the array of bulbous elements 22 using either flexible boundary collar 26 or inflatable boundary collar 33. This arrangement involves mounting bulbous elements 22 so that any change of shape will cause an area reduction and constrain bulbous elements 22 even more tightly.

Some foreseeable variations to the previous arrangements are discussed in FIGS. 9, 10, 11, 12, 13. FIG. 9A depicts bulbous element 22 as sphere like entities. FIG. 9B shows that locking element relief hole for striker pin 34 can be placed into the construction of bulbous element 22. This hole allows the diameter of striker pin post 24 to be increased without adjusting the spacing of bulbous element 22. FIG. 9C shows that a more rigid array might be achieved by placing locking element flat face 35 into the construction of bulbous element 22. This retards the rotation and translation directions bulbous element 22 could be displaced. This modification causes a more extreme break away force, where the system holds fast until a threshold force is reached and then releases. Fig. 10A shows variations to the actual shape of the upper hemisphere of bulbous element 22 as depicted by round top locking element 36, cone top locking element 37, and truncated cone top locking element 38. Fig. 10B shows variations to the actual shape of lower hemisphere of bulbous element 22 as depicted by round bottom locking element 39, cupped bottom locking element 40, and grooved bottom locking element 41. Fig. OC shows various combinations of the variations shown in FIG. 10A and Fig. 10B. Fig.11 shows that the array of bulbous elements 22 can be altered by adding consecutive bulbous elements 22 and bulbous element shafts 21 to rigid clamping array base plate 20. Fig.11 also shows that the striker pin assembly can be altered in the same fashion. FIG. 12 shows a variation in the placement and quantity of the striker pin assemblies consisting of striker pin post 24 and striker pin head 25. By placing more than one striker pin head 25 and striker pin post 24 the array of bulbous elements 22 is now constrained rotationally as well as axially. FIG. 13 shows striker pin head 25 and striker pin post 24 being attached to flexible material 43 by way of striker pin mounting plate 42.

FIG. 14A, 14B, 14C depicts another alternative for constraining the array be means of flexible tensioning element 45 and rigid pulling member 44. In FIG. 14A flexible tensioning element 45 are attached to rigid pulling member 44 which pass through (passage through the rigid clamping array base plate, bulbous element shaft, and bulbous element) 30 and are retained by flexible tensioning element retainer 46. With rigid pulling member 44 in a lowered position as shown in FIG. 14B striker pin head 25 can penetrate the array of bulbous element 22 and proceed past bulbous element 22 into the array. After striker pin head 25 has past the array of bulbous elements 22, rigid pulling member 44 can be pulled upward so that flexible tensioning element 45 is placed in tension and constrains the array of bulbous elements 22.

2. Summary, Ramification, and Scope of Invention

The following invention details how two surfaces can be bound together. One surface contains loosely spaced pins with heads which can be engaged into an array of tightly packed bulbous elements upon another surface. The pins are then retained by constraining the array in various ways. The surfaces can be released by un-constraining the array of bulbous elements. This procedure may be repeated a multitude of times. The binding system described in this application provides an apparatus for binding two or more surfaces rigidly and securely in a way that the surfaces can be quickly engaged at any location and in any rotation. The apparatus has relatively large voids between the bulbous element posts as compared to the striker pin post; therefore, the binding is insensitive to foreign matter such as snow and ice in the closure system.

In the externally retained system as shown in FIG. 3A, 3B, 3C the apparatus can be adjusted as to regulate the force needed to separate the two surfaces independent of the closing force. This regulation can be achieved by slacking the cable in the boundary collar for pin insertion and tensioning it with a spring so that the spring force determines the break away force. Since the arrays elements never leaves their local area and their ability to move is controlled externally the apparatus has a repeatable closure holding force. If one or more of these system interlocked together then simultaneous release of many systems is possible. This could be accomplished by using one continuous cable in the boundary collar of many arrays. When the cable is slacked all the arrays will release. By using one or more striker pins the system can either allow rotational movement (one pin) or resist torsional forces (two or more pins).

One of the features of this apparatus is its ability to be scaled to a larger size. Any size variation of any element of this device should be considered to be included in the scope of this apparatus. The selection and color of material of any element of this device may vary. The array elements and the pins may be made in separate components or be single entities.

While my above description contains many specificities, these should not be construed as limitations on the scope of the invention, but rather as an exemplification of one preferred embodiment thereof Many other variations are possible.

Accordingly, the scope of the invention should be determined not by the embodiments illustrated, but by the appended claims and their legal equivalents.

What is claimed is:

1. A reusable binding system for binding two articles, comprising:
    a first said article, at least one surface of which is configured with a multiplicity of bulbous element shafts terminating in a planar array of bulbous elements of substantially uniform size, each said bulbous element tangentially contacting an adjacent said bulbous element,
    a second said article, at least one surface of which is configured with at least one striker pin post terminating in a striker pin head, the diameter of said pin head being larger than the space between adjacent said bulbous elements, further comprising means for restraining the relative position of said bulbous elements.

2. The reusable binding system of claim 1, said means for restraining comprising a flexible boundary collar within which said multiplicity of bulbous element shafts is contained.

3. The reusable binding system of claim 2 said collar having means for tensioning against elongation.

4. The reusable binding system of claim 1 said means for restraining comprising a rigid boundary collar within which said multiplicity of bulbous element shafts is contained.

5. The reusable binding system of claim 1, said boundary collar being retractable.

6. The reusable binding system of claim 1, said means for restraining comprising an inflatable boundary collar within which said multiplicity of bulbous element shafts is contained.

7. The reusable binding system of claim 1 the underside shape of said bulbous elements being configured with a concave surface conforming closely to the underside shape of said pin head.

8. The reusable binding system of claim 1, the underside shape of said pin head configured with a concave surface conforming closely to the underside shape of said bulbous elements.

9. A reusable binding system for binding two articles, comprising:
    a first said article, at least one surface of which is configured with a multiplicity of bulbous element shafts terminating in a planar array of bulbous elements of substantially uniform size in close proximity to each other,
    a second said article, at least one surface of which is configured with at least one striker pin post terminating in a striker pin head, the diameter of said pin head being larger than the space between adjacent said bulbous elements,
    said surface of said first article configured with a multiplicity of holes, said bulbous element shafts having axially oriented lumens connecting with said holes, said system further comprising a retractable shaft stiffener array engagable with said bulbous element shafts by passage through said holes into said lumens.

10. reusable binding system for binding two articles, comprising:
    a first said article, at least one surface of which is configured with a multiplicity of bulbous element shafts terminating in a planar array of bulbous elements of substantially uniform size in close proximity to each other,
    a second said article, at least one surface of which is configured with at least one striker pin post terminating in a striker pin head, the diameter of said pin head being larger than the space between adjacent said bulbous elements,
    said surface of said first article configured with a multiplicity of holes, said bulbous element shafts having axially oriented lumens connecting with said holes, said system further comprising a retractable tensioning element anchor connected by a multiplicity of tensioning elements passing through said holes and said lumens to said bulbous elements.

11. A binding system for attaching a pair of boots to a snowboard, comprising:
- at least two clamping array base plates attachable to said boot,
- a multiplicity of flexible bulbous element shafts of uniform height protruding from each said base plate, each said shaft terminating in a bulbous element, said shafts arranged to place said bulbous elements in a planar relationship, each said bulbous element tangentially contacting an adjacent said bulbous element,
- a striker plate attachable to said snow board, at least one striker pin post protruding from said striker, the diameter of said pin head larger than the space between adjacent said bulbous elements, further comprising means for restraining the relative position of said bulbous elements.

12. The reusable binding system of claim 11, said means for restraining comprising a flexible boundary collar within which said multiplicity of bulbous element shafts is contained.

13. The reusable binding system of claim 12 said collar having means for tensioning against elongation.

14. The reusable binding system of claim 11, said means for restraining comprising a rigid boundary collar within which said multiplicity of bulbous element shafts is contained.

15. The reusable binding system of claim 14, said boundary collar being retractable.

16. A reusable binding system for binding two articles, comprising:
- a clamping array base plate attachable to a first said article,
- a multiplicity of flexible bulbous element shafts of uniform height protruding from said base plate, each said shaft terminating in a bulbous element, said shafts arranged to place said bulbous elements in a planar relationship, each said bulbous element tangentially contacting an adjacent said bulbous element,
- a striker plate attachable to a second said article,
- at least one striker pin post protruding from said striker plate, each said post being longer than the radius of any said bulbous element and terminating in a striker pin head, the diameter of said pin head being larger than the space between adjacent said bulbous elements, further comprising means for restraining the relative position of said bulbous elements.

17. The reusable binding system of claim 16, said means for restraining comprising a flexible boundary collar within which said multiplicity of bulbous element shafts is contained.

18. The reusable binding system of claim 17, said collar having means for tensioning against elongation.

19. The reusable binding system of claim 17, said means for restraining comprising a rigid boundary collar within which said multiplicity of bulbous element shafts is contained.

20. The reusable binding system of claim 19, said boundary collar being retractable.

* * * * *